United States Patent
Kirsch et al.

[11] Patent Number: 6,057,573
[45] Date of Patent: May 2, 2000

[54] DESIGN FOR HIGH DENSITY MEMORY WITH RELAXED METAL PITCH

[75] Inventors: Howard C. Kirsch, Austin, Tex.; Chih-Yuan Lu, Hsinchu, Taiwan

[73] Assignee: Vanguard International Semiconductor Corporation, Hsin-Chu, Taiwan

[21] Appl. No.: 09/313,305

[22] Filed: May 17, 1999

Related U.S. Application Data

[62] Division of application No. 09/085,612, May 27, 1998, Pat. No. 5,933,725.

[51] Int. Cl.[7] ................................................ H01L 21/8242
[52] U.S. Cl. .......................... 257/296; 257/390; 257/758
[58] Field of Search .................................. 257/390–391, 257/315–317, 300, 296, 903–908, 758; 365/185.5, 185.37

[56] References Cited

U.S. PATENT DOCUMENTS

| | | | |
|---|---|---|---|
| 5,990,507 | 1/2000 | Mochizuki et al. | 257/295 |
| 6,018,195 | 1/2000 | Takebuchi | 257/752 |

*Primary Examiner*—Jey Tsai
*Attorney, Agent, or Firm*—George O. Saile; Stephen B. Ackerman

[57] ABSTRACT

A method and design for stitching polysilicon wordlines to straps formed of interconnected metal line segments formed in two or more metallization levels. Each strap comprises a continuous conductive metal line passing alternatively from one metal layer to another in a selected sequence. The sequence of segments in each strap alternates in phase with the sequence in next nearest neighbor straps but may be in phase with second nearest neighbor straps. Thereby the pitch of strap segments on each metallization level is at least twice that of the subjacent polysilicon wordlines. The total length of each metal in each strap is the same in all straps. This arrangement allows the use of metals having different resistivities in each strap with all the straps having identical overall resistance. The metals used in the two or more levels may also have different minimum design rules without compromising the identical overall performance of all the straps. In a second embodiment a method and design is described for doubling the length of polysilicon sub-wordlines in a sub-wordline memory array without reducing performance by connecting sub-wordline to sub-wordline decoders by metal straps connected to the sub-wordlines midpoints.

6 Claims, 8 Drawing Sheets

DESIGN FOR HIGH DENSITY MEMORY WITH RELAXED METAL PITCH

This is a division of patent application Ser. No. 09/085,612, filing date May 27, 1998, U.S. Pat. No. 5,933,725 A Word Line Resistance Reduction Method And Design For High Density Memory With Relaxed Metal Pitch, assigned to the same assignee as the present invention.

BACKGROUND OF THE INVENTION (1) Field of the Invention

The invention relates to processes for the manufacture of semiconductor devices and more particularly to the design of wordlines in high density memory integrated circuits.

(2) Background of the Invention and Description of Prior Art

High density memory integrated circuits, in particular dynamic random access memory(DRAM) circuits and non-volatile memory circuits such as flash or read only memory (ROM) contain large rectangular arrays of cells, each of which represents a single bit of memory storage. Digital information is written to and read from these cells by peripheral circuitry which addresses each cell through word-lines and bitlines. In a typical DRAM, each storage cell consists of a polysilicon gate metal oxide silicon field effect transistor (MOSFET) and a capacitor. A wordline comprises a continuous band of gate level polysilicon passing alternately over field oxide and over the channel regions of access MOSFETs in the string of memory cells addressed by the wordline. Switching a voltage signal on the wordline from a low to a high voltage turns the access MOSFETs on (for n-channel MOSFETs) and electrically connects the cell's storage capacitor to a bitline for sensing (i.e. accessing the cell). Switching from the high down to the low voltage ends the access. Hence, taking the wordline from low to high or from high to low is the critical path for cell access times. The performance of the DRAM array is dependent upon the speed with which these voltage transitions take place. That speed in turn depends upon the RC(resistance-capacitance) time constant of the wordline.

In order to achieve high performance, the resistive component R must be as small as possible. As a conductor, polysilicon, even heavily doped, cannot compare with other metals such as for example aluminum. Various silicides were pioneered in DRAM gate polysilicon technology (e.g. $WSi_x$, $TaSi_x$, $MoSi_x$) to reduce the sheet resistance and improve wordline speed. These silicides typically had 8–15 $\Omega/\square$ (ohms per square) sheet resistances. Unfortunately, the much lower sheet resistance in-situ formed silicides/salicides ($TiSi_x$, and $CoSi_x$) turned out to be difficult to apply to DRAM wordlines because the high temperature steps involved in DRAM cell formation caused their conductance to degrade.

As requirements on DRAM speeds became more demanding and arrays became larger, the need for reducing the resistivity of wordlines becomes even more important. A solution which has met with considerable success is the strapping of the polysilicon wordlines with bands formed in a superjacent metal level, for example aluminum or tungsten. The selected metallization level may be any wiring level above the polysilicon wordlines except the level used to form bitlines (if metal bitlines are used). Practically, in order to avoid unnecessary interconnections, the next available higher level is preferred.

The sheet resistances of the metal bands are tens to hundreds of $m\Omega/\square$ (milliohms per square) making them very effective in reducing the RC time constant of wordlines. The strapping is accomplished by forming a metal line in a metallization level lying directly over and running parallel with the polysilicon wordline and spaced from it by an insulative layer. Periodic contacts between the lines direct most of the current flow through the low resistance metal lines.

Figure 1:
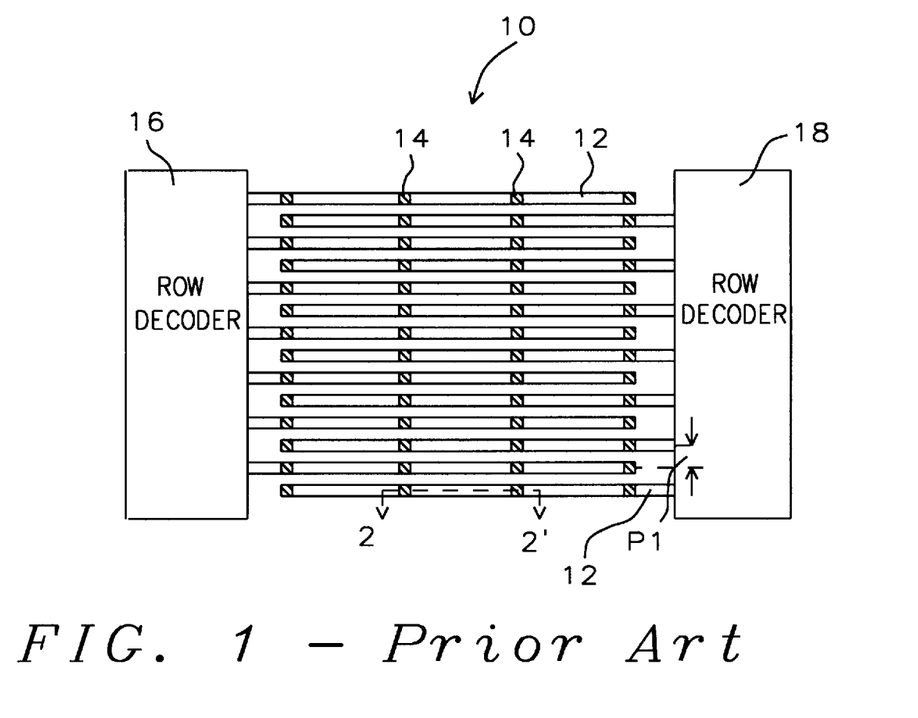
FIG. 1 is a plan view of a memory cell array showing a prior art pattern of stitched wordlines.

A simple case of wordline strapping in a memory cell array 10 is shown in FIG. 1. In this example the metal lines 12 are formed in a single metallization level, for example a first aluminum level. The metal lines 12 are stitched to underlying polysilicon word lines(not shown) which lie directly below the metal lines 12, by means of interlevel contacts 14. Alternate metal lines 12 are directed to two banks of row decoder circuitry 16, 18 located at either side of the cell array 10. The pitch of the metal lines $p_1$, is defined as the distance between one point on a line and a corresponding point on an adjacent line, in other words, the periodicity of the lines.

As the density of memory arrays increases the pitch of the wordlines decreases. The corresponding decrease in pitch of the metal lines has also driven a decrease in the design rule for the metal lines. The rate of decrease in the metal line design rule has exceeded the rate of design rule decrease for the polysilicon wordlines. This causes depth of field(DOF) problems in the metal line lithography wherein topographical steps occur between the cell array and the peripheral circuitry. These effects are discussed in an article by Saeki, T., Kasai, N., Itani, T., Nishimoto, S., and Fukuzo, Y. in IEEE Transactions on Semiconductor Manufacturing, Vol. 9, No. 1, February 1996, page136ff. A Boosted Dual Wordline(BDWL) design scheme is described which relaxes the design metal design rule and improves the circuit yield. However, the design requires additional sub-wordline drivers and drive lines. Images in the peripheral circuits are governed by looser ground rules than those in the array and are therefore less affected by DOF problems. However, this does not apply to wordlines and bitlines traversing the step from the array to the peripheral circuits.

Mazzali, U.S. Pat. No. 5,644,526 cites a variation of the single metallization strapping method wherein the straps are interrupted on the metallization level such that only portions of the subjacent wordlines are re-enforced by conductive straps. The interruptions are in staggered patterns with the purpose of reducing the incidence of shorts caused by defects. In the effort to reduce the incidence of shorts, wordline speed is sacrificed by reducing the amount of upper level metal conductivity enhancement.

Figure 2:
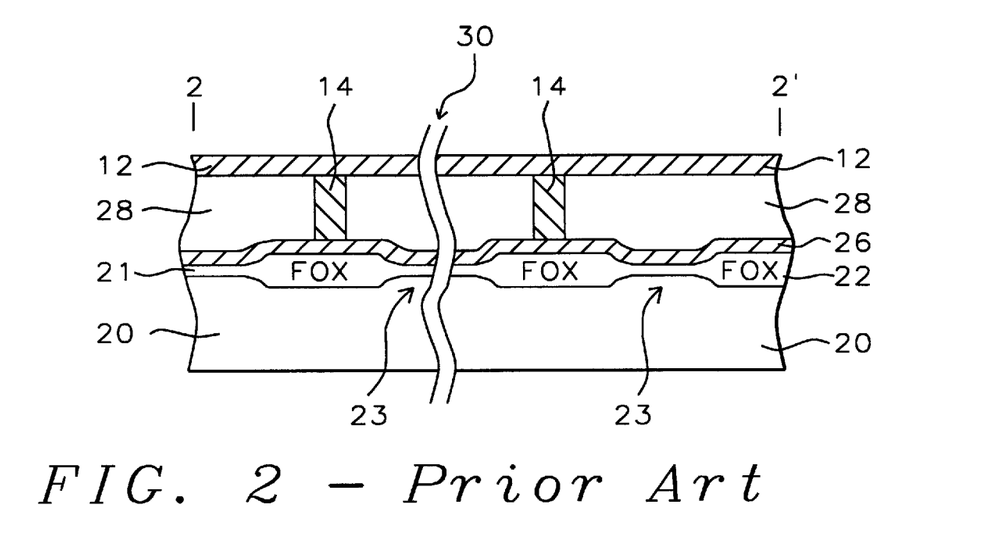
FIG. 2 is a cross sectional view of a polysilicon wordline stitched to a parallel metal line.

FIG. 2 is a cross sectional representation of a wafer 20 with a portion of the memory cell array 10 along the line 2–2' of FIG. 1. The polysilicon wordline 26 passes alternately over regions of field oxide isolation(FOX) 22 and silicon active area 23. The interlevel contacts 14 form the stitching between the polysilicon wordline 26 and the first level metal line 12 directly above it on the planarized inter level dielectric layer(ILD) 28. The break 30 in the cross section indicates that multiple FOX/active region pairs may be present between the two adjacent contacts 14 of the cross section 2–2'.

The narrow pitch $p_1$ required of metal level lines formed in a single metal level limits their practical width and thereby limits their resistivity. By stitching the polysilicon wordlines alternatively to two levels of metallization, the pitch can be doubled as is shown in the plan view of FIG. 3. The metal lines 12 are formed in a first metallization level while the lines 24 are formed in a second metallization level.

Figure 3:
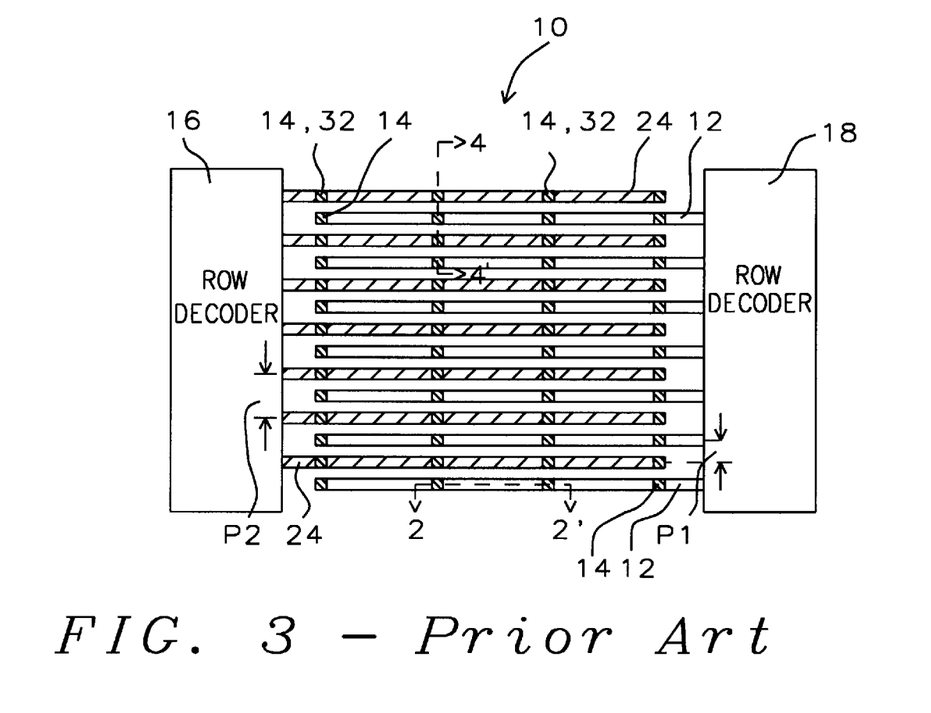
FIG. 3 is a plan view of a prior art stitched wordline configuration using two levels of metal to achieve a relaxed metal line pitch.

The pitch $p_2$ on each metallization level is twice the pitch $p_1$ when only a single metallization level is used. Doubling the pitch allows, not only relaxation of the design rule, but also permits broadening large portions of the lines on each level (broadening not shown), thereby lowering their resistance.

Figure 4:
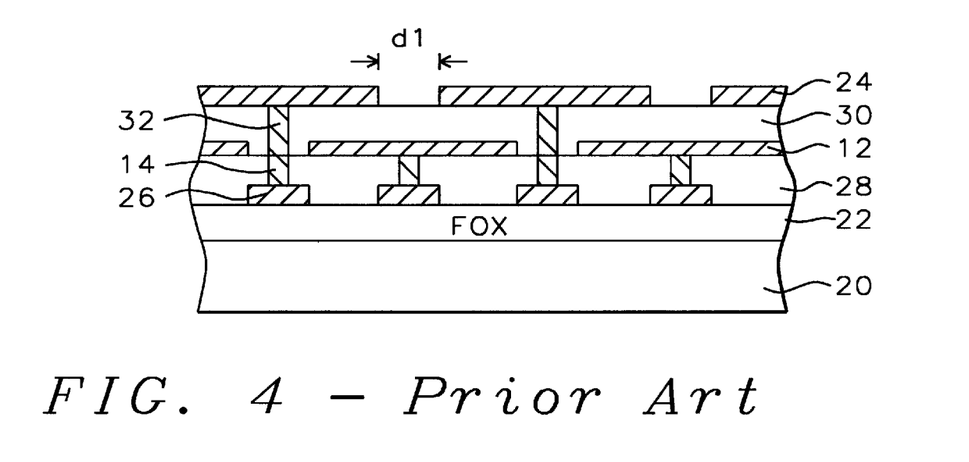
FIG. 4 is a cross sectional view of a prior art stitched wordline configuration using two levels of metal to achieve a relaxed metal line pitch and broad wordlines.

The broadening of the metal lines 12, 24 is not shown in FIG. 3 because the overlap would confuse the plan view. However, the effect can easily be visualized and comprehended in the cross section 4–4' shown in FIG. 4. The lines in the second metallization level 24 overlie a second intermetal dielectric(IMD) layer 30 and access the subjacent polysilicon wordlines 26 through vias 32 and contacts 14. The design rule relaxation is realized in the spacing $d_1$ between the lines. Stitching polysilicon wordlines to two metallization levels in the manner just described to improving wordline performance has several major drawbacks which relate to their necessity to fit into an existing process.

A first drawback is that both metallization levels must have identical specific resistances in order for the wordlines 12 and 24 to render equivalent performance. The metallization levels available for stitching the wordlines are dictated by the design of the process and often are not identical. For example, the first available level might be tungsten having a resistivity of 300–500 m$\Omega$/□, while the second metal might be aluminum with a resistivity of 30–60 m$\Omega$/□.

Another problem with this method is that one of the available metallization levels may not be globally planarized and therefore may not be capable of extending across the boundary between the cell array an the peripheral decoder circuitry because of a step at the boundary. The step height generally exceeds the depth of field required by the high resolution stepper to resolve lines on both sides of the step.

Kim. et.al., U.S. Pat. No. 5,631,183 form wordlines which are folded in half, thereby using a single wide superjacent metal line over the folded gate electrode. The cells in the folded gate string are stitched in pairs to the metal strap. In this arrangement the pitch of the metal lines is half the pitch of the subjacent wordlines and the metal strap is half the overall length of the wordline.

Many modern DRAMs avoid wordline stitching entirely in order to avoid tight metal pitches in the array. Instead they rely on splitting the wordlines into many individually driven sections called sub-wordlines. These sub-wordlines are short enough (e.g. 256 to 1024 cells) so that they do not require stitches to achieve sufficient speed. However, the individual drivers occupy valuable chip area. It is therefore desirable to have as many cells as possible on a given sub-wordline.

SUMMARY OF THE INVENTION

Accordingly, it is an object of this invention to provide a design and a method for increasing the pitch of metal lines to which polysilicon wordlines are stitched.

It is another object of this invention to provide a design and a method for reducing the resistance of metal lines to which polysilicon wordlines are stitched in order to lower overall wordline resistance.

It is yet another object of this invention to provide a design and a method for relaxing the design rule of metal lines to which polysilicon wordlines are stitched thereby improving yield.

These objects are accomplished by stitching said polysilicon wordlines to straps formed by connecting alternating segments of metal lines formed in two or more metallization levels. Each strap comprises a continuous metal line passing alternatively from one metal layer to another in a selected sequence. The sequence segments in each strap is never in phase with the sequence of its next nearest neighbor but may be in phase with a second nearest neighbor. The total length of each metal in each strap is the same in all straps. This arrangement allows the use of metals having different resistivities in each strap with all the straps having identical overall resistance. The metals used in the two or more levels may also have different minimum design rules without compromising the identical overall performance of all the straps.

In addition, being out of phase, adjacent straps will not have adjacent metal segments on the same metallization level. The latter condition doubles the metal pitch in all regions except directly at the metal interconnections. This permits, significant widening of the line segments but also allows relaxation of minimum design rules for the metal spacing.

It is another object of this invention to provide a design and a method for doubling the number of cells in a poly-silicon sub-wordline connected to a sub-wordline driver in a sub-wordline section of a DRAM memory cell array without compromising its performance.

This object is accomplished by doubling the number of cells in said polysilicon sub-wordline and forming a metal strap in a metallization level above said polysilicon sub-wordline and connecting said strap between the center of said polysilicon sub-wordline and a sub-wordline driver.

DESCRIPTION OF THE PREFERRED EMBODIMENTS

The embodiments of this invention are employed within the framework of conventional DRAM fabrication, adhering as closely as possible with established processing methods. The features of the invention begin to be incorporated at the stage in the DRAM manufacturing process when the basic components of the DRAM memory cell have been formed using processing steps well known in the art. However, provisions must be made in the mask designs used in the formation of these basic components to allow stitching paths from upper metal layers to polysilicon wordlines when such stitching is required.

The DRAM design used to illustrate the embodiments is one of a stacked capacitor(STC) type, having bitlines formed of metal silicide below the capacitor plates. There are a great number of variations of DRAM cell designs. Some have the bitlines formed over the cell capacitor plates and others below. Many efforts have been made to maintain a large plate area of the cell capacitor while accommodating the shrinking available projected area. These have led to a variety of cell capacitor designs and methods of fabrication which are well know to those in the art. The current embodiments use, as an example, an integrated circuit design and process for the manufacture of a diagonal active stacked-capacitor with a highly packed storage node (DASH) cell DRAM. It should be understood that the principles and features of the current invention may be equally applied to other memory cell designs and processes.

Figure 5:
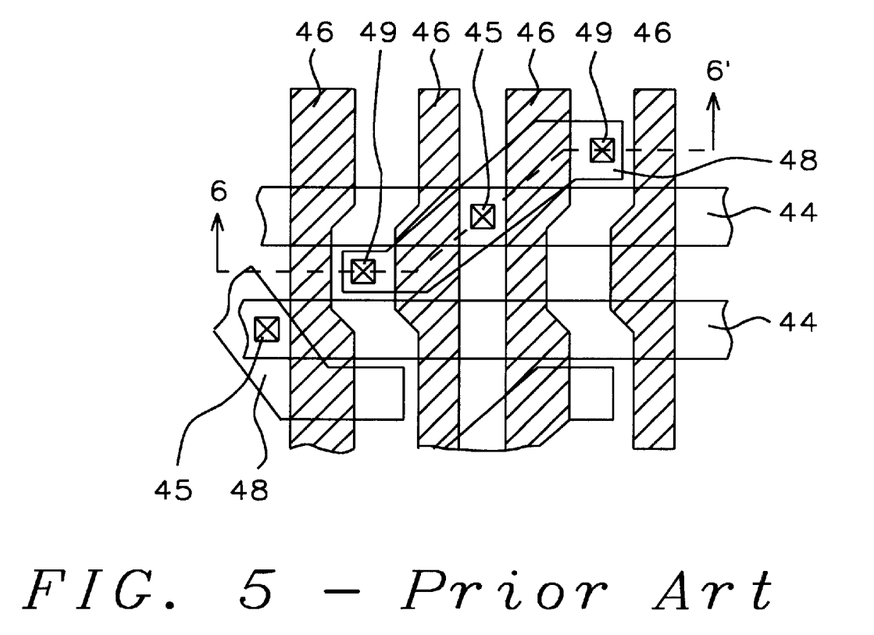
FIG. 5 is a plan view of a DASH DRAM memory cell configuration.

Referring to FIG. 5, a top view of a DASH cell DRAM cell array is shown. The active silicon regions 48, are diagonally disposed to the perpendicular wordlines 46 and bitlines 44. The bitlines contacts 45 and of the capacitor storage plates contacts 49 to their respective silicon active regions are shown.

Figure 6:
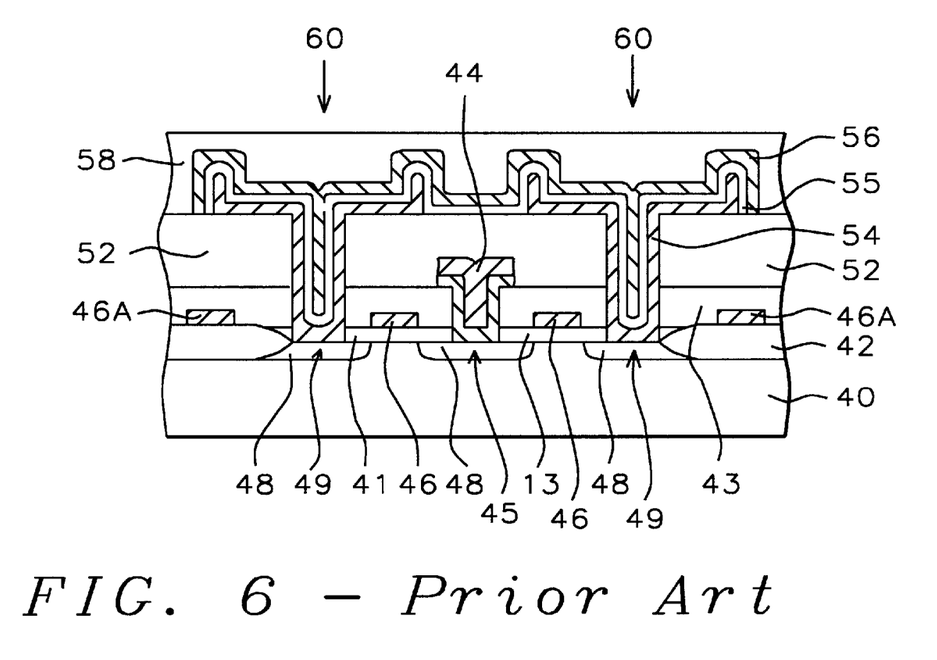
FIG. 6 is a cross sectional view showing a prior art DRAM memory cell configuration.

A cross sectional view of the cell features taken along the line 6–6' of FIG. 5 is shown in FIG. 6. Two storage capacitors 60, are shown formed on a silicon wafer 40. The lower, storage plates 54 contact the silicon active area 48 of two adjacent metal oxide field effect transistors (MOSFET)s whose gates 46 comprise polysilicon wordlines. A bitline 44 connects to the common silicon active area 48 of the two MOSFETs. The polysilicon wordlines 46A located over field oxide regions 42 service other MOSFETS located in the array above and below the plane of the page. Inter-polysilicon-insulator (IPO) layers 43 and 52 support and insulate the large area portions of the capacitors 60 above the wordline/bitline array. The capacitor dielectric, typically, a composite layer of $SiO_2/Si_3N_4/SiO_2$ (ONO) 55, is covered by the upper cell plate 56 which spans a plurality of cells.

An inter-level-dielectric (ILD) layer 58 insulates the upper cell plate 56 from a subsequently deposited metal layer, which becomes a first wiring level. The processing steps for forming the DRAM cell configuration up to the point shown in the plan view of FIG. 5 and in cross section by FIG. 6 are well known to those in the art and will not be detailed in the discussion of the embodiments of the current invention.

In a first embodiment of this invention a DRAM cell array is formed having polysilicon wordlines stitched alternately to interconnected line segments formed in two layers of metal. Wordline decoders are placed on opposite sides of the array and the alternately stitched wordlines are formed so that the line segments which pass over the transition region between the peripheral wordline decoders and the cell array are all formed from the same layer.

Referring to FIG. 6, a p-type monocrystalline silicon wafer 40 is provided. Field oxide isolation regions 42 are formed on the wafer by the well known local oxidation of silicon (LOCOS). A gate oxide 41 is formed, preferably by thermal oxidation, and a polysilicon wordlines 46, 46A are formed by first depositing a polysilicon layer using low pressure chemical vapor deposition(LPCVD) methods, doping the layer by ion implantation, and patterning the layer by well known photolithographic methods and reactive ion etching(RIE). The polysilicon wordlines 46, 46A may also be of composite construction, for example, having a deposited layer of a metal silicide over the doped polysilicon.

The source/drain regions 48 of the MOSFETs are next formed by implanting n-type ions, for example, arsenic or phosphorous, into the silicon. A layer of inter-poly oxide (IPO) is next deposited by LPCVD and openings for bitline contacts 45 are patterned and etched. A composite layer comprising doped polysilicon and a refractory metal silicide, for example $WSi_x$ is next deposited over the wafer 40. The composite layer is then patterned and etched forming bitlines 44. A second IPO layer 52 is next deposited. This layer 52, preferably of a borophosphosilicate glass(BPSG), is then flowed at between 600° C. and 800° C. to bring about a local planarization its surface.

The storage capacitors 60 are next formed by procedures well known in the art. First access openings to the silicon active areas 48 are etched. Doped polysilicon is deposited and patterned to form a storage plate 54. An ONO dielectric layer 55 is next deposited followed by a doped polysilicon layer which is patterned to form the upper cell plate 56. An (ILD) layer 58 preferably of BPSG is the deposited over the wafer 40 and planarized over the cell array region, preferably by re-flow or by RIE etchback techniques. These procedures are well known in the art. Partial chemical mechanical polishing(CMP) techniques are currently unreliable but may find future use in this application.

The cell array, at this stage of processing is essentially complete. The next sequence of processing steps form wiring interconnections to the DRAM peripheral circuits. The wiring metallization levels are also used to form the metal straps to which the polysilicon wordlines are stitched. In the current embodiment, contact openings are etched by RIE, in the insulative layer over the peripheral devices, exposing the elements of the devices. Tungsten plugs are then formed in these openings by depositing a conformal blanket layer of tungsten and etching the tungsten layer back to the insulative layer surface by RIE or by CMP. By patterning the tungsten layer with photoresist, tungsten interconnects between contacts may also be formed. The formation of tungsten interconnects is well known by those in the art and will not be examined in detail here.

Figure 7:
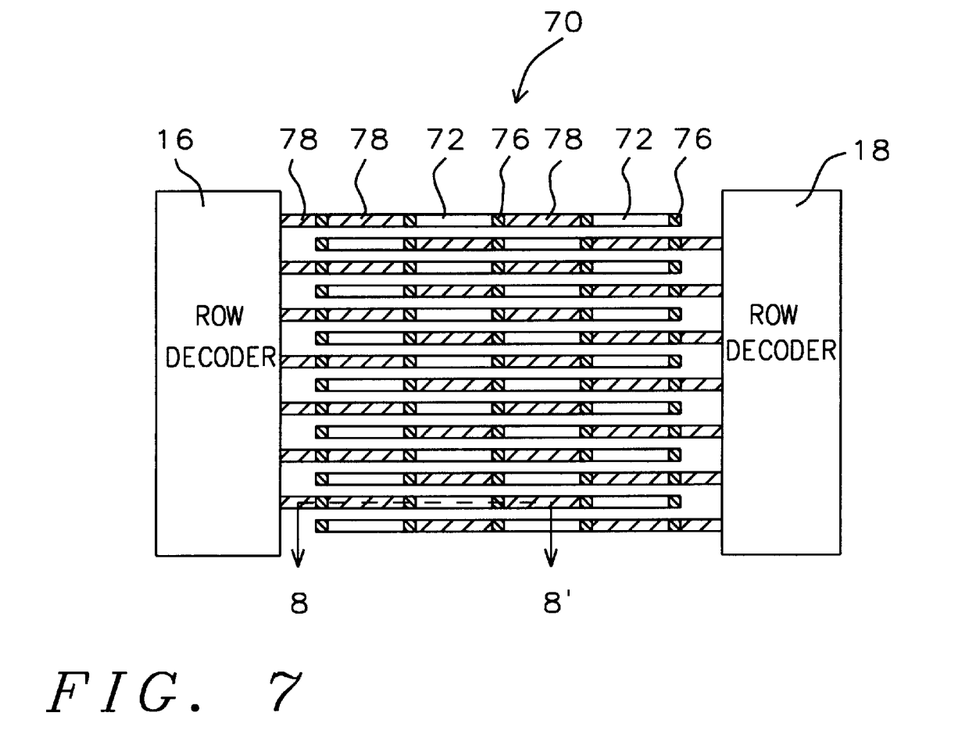
FIG. 7 is a plan view of a DRAM cell array showing wordlines stitched to two levels of metal according to the teaching of this invention.

Referring now to FIG. 7 there is shown a plan view of the wordline strapping arrangement 70 as taught by this invention. The tungsten contact/interconnect metallization level is used by the current embodiment to form the strap segments 72 (un-shaded portions) of the first of two metal layers to which polysilicon wordlines are stitched. The aluminum level, which forms further interconnections of devices in the peripheral circuits of the DRAM, is used by the current embodiment to form the second set of strap segments 79 (shaded portions). The interlevel contacts 76 connect the metal segments forming a continuous wordlines and also form the stitching connections to the subjacent polysilicon wordlines.

The arrangement shown overcomes the problems incurred by the stitched wordline scheme shown in FIG. 3. All of the wordline straps have the same proportionate length of each of the two metal levels, thereby having the same resistance and consequently yielding identical performance. Thus two metals having markedly dissimilar resistivities are effectively combined to form identical wordlines.

The pitch of the individual segments on each metallization level is twice the pitch of the polysilicon wordlines, thereby relaxing the minimum design rule and improving yield by lowering defect critical area.

By alternating the segments of each wordline between two metallization level as taught by this invention, it is possible to breech the transitional step between the cell array and the peripheral circuits with the same metal on each wordline strap. In the current embodiment, the aluminum level is used to make this transition. The wordline strap connections to row decoder 16 and those made row decoder 18 are by aluminum segments 78. The advantage of this feature will become clear in a later section wherein the formation of the metal strapping lines will be presented with reference to cross sectional views.

Figure 8:
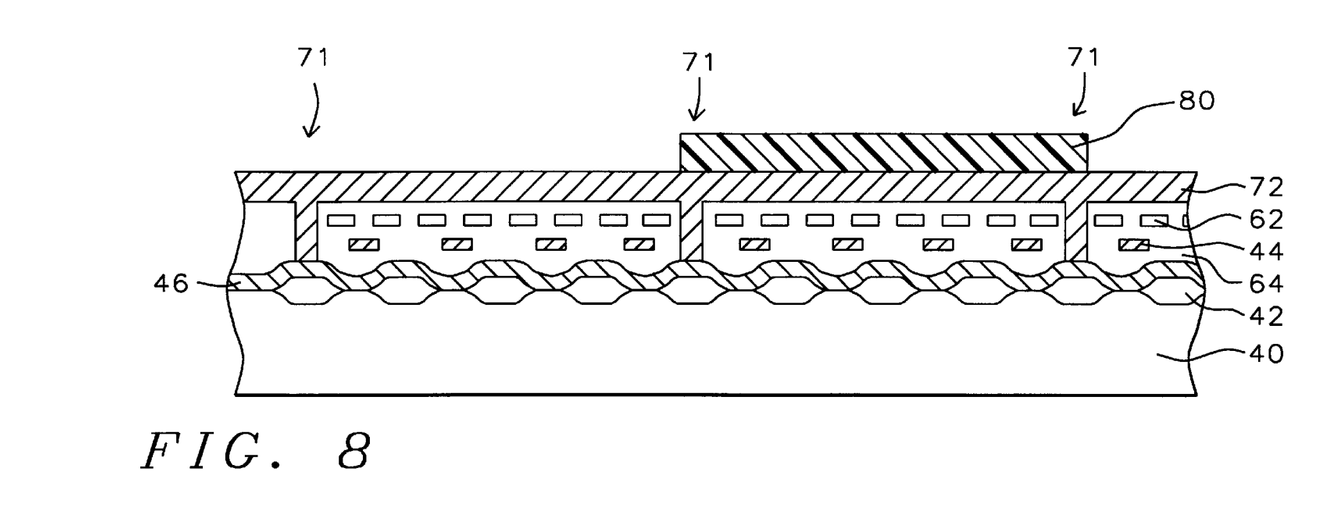
FIG. 8 through FIG. 11 are cross sectional views of process steps used in forming a first embodiment of this invention.

Referring now to FIG. 8 there is shown a cross section of the wafer 40 taken along the length 8–8' of a wordline in FIG. 7. The cross section runs perpendicular to that shown in FIG. 6. The polysilicon wordline 46 is shown as it traverses from one cell to the next alternately over active silicon areas and regions of field oxide 42. The bitlines 44 are shown running perpendicular to the plane of the page bitline contacts with the device active areas are made at points above and below the plane of the page. As can be observed in FIG. 6, the storage capacitors 60 project over the wordlines over field oxide 46A. These projections into the plane of the cross section in FIG. 8 through FIG. 11 are represented by the rectangles 62. The insulative layer 64 is the composite of the insulative layers 43, 52 and 58 of FIG. 6. The processing sequence for forming the metal strapping arrangement will now described.

Contact openings 71 are patterned and etched though the insulative layer 64 exposing the subjacent polysilicon word line 46. An adhesion/barrier layer of Ti/TiN (not shown) is typically applied into the contact openings 71 and over the surface of the wafer prior to tungsten deposition. A tungsten layer 72 is next deposited by well known CVD techniques. The layer is patterned with photoresist 80 to protect a tungsten stripe which is to become a segment of the wordline strap. This photo step is an added process step required only to define the tungsten straps in the cell array. Tungsten interconnects, which are similarly defined, may be used in the peripheral circuits. Although tungsten may be used in the peripheral circuitry topological concerns prohibit it's usage at the array edges. Normally the blanket deposited tungsten is merely etched back to the insulative layer 64 leaving tungsten plug contacts in the openings of the peripheral devices.

Figure 9:
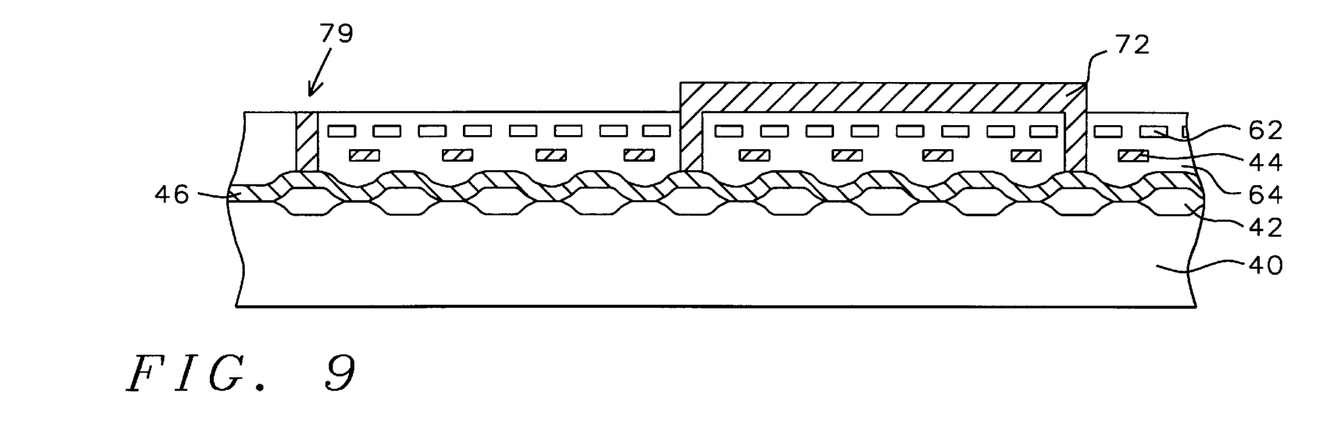

Referring next to FIG. 9 the exposed tungsten layer 72 is etched back to the surface of the insulative layer 64 leaving the tungsten plug 79 and the tungsten strap 72 connected at both ends to the polysilicon wordline. The processing is performed by RIE using well known tungsten etchants. Tungsten plugs are simultaneously formed in the peripheral circuits by these process steps. The photoresist layer 80 is then stripped, preferably by oxygen plasma ashing or by conventional liquid strippers.

Figure 10:
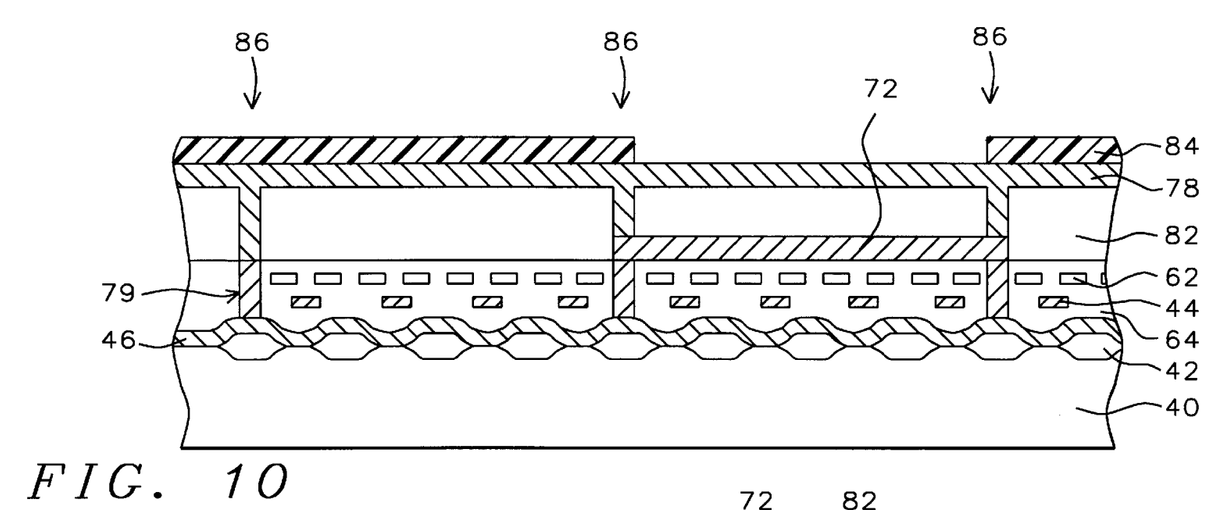
Figure 11:
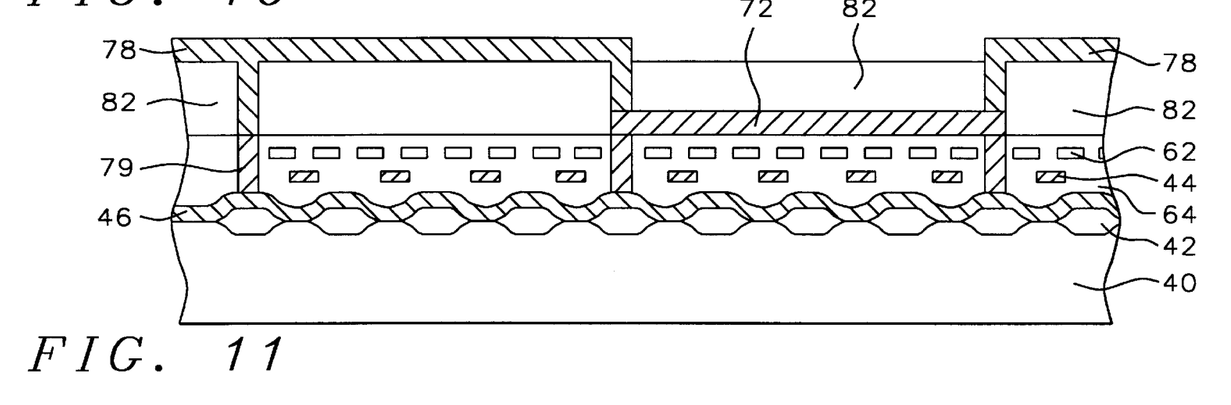

Referring to FIG. 10, an insulative layer 82 is deposited. This layer 82, preferably of BPSG is globally planarized over the wafer, preferably by CMP. Via openings 86 are then patterned and etched into the insulative layer 82 exposing the ends of the tungsten segment 72 and the tungsten plug 79. A layer of aluminum 78 is deposited filling in the vias 86 with metal. The aluminum layer 78 is then patterned with photoresist 84 and etched by RIE to form the aluminum strap segments of the wordline. The completed wordline strap is shown in FIG. 11.

Aluminum is used as the second metallization layer in the embodiments of this invention. It should however, be understood that the invention is not restricted to the use aluminum for the wiring level or levels above the tungsten level but other metals, for example an aluminum alloy, copper, and a copper alloy may also be employed in this application without departing from the spirit of the invention.

The first aluminum wiring level of the peripheral circuitry is concurrently formed in these process steps. The aluminum interconnective wiring accesses the subjacent tungsten plugs through vias patterned in the insulative layer 82 over the peripheral devices (not shown).

FIGS. 8 through 11 show wordline stitches (connections to the polysilicon wordline) occurring at four bitline intervals. This interval is used for illustrative purposes only. It is to be understood that the stitches may be many more bitlines apart. It is also to be understood that a single wordline strap segment of either metal may have multiple stitches to the polysilicon wordline.

In a second embodiment of this invention a sub-wordline array is formed with metal straps derived from a metallization level above the polysilicon wordline which make connection to the center of the polysilicon wordline. This embodiment employs only a single metallization level and requires only a single wordline stitch. By connecting the highly conductive strap to the center of the polysilicon wordline the wordline length can be doubled without compromising its performance.

Figure 12:
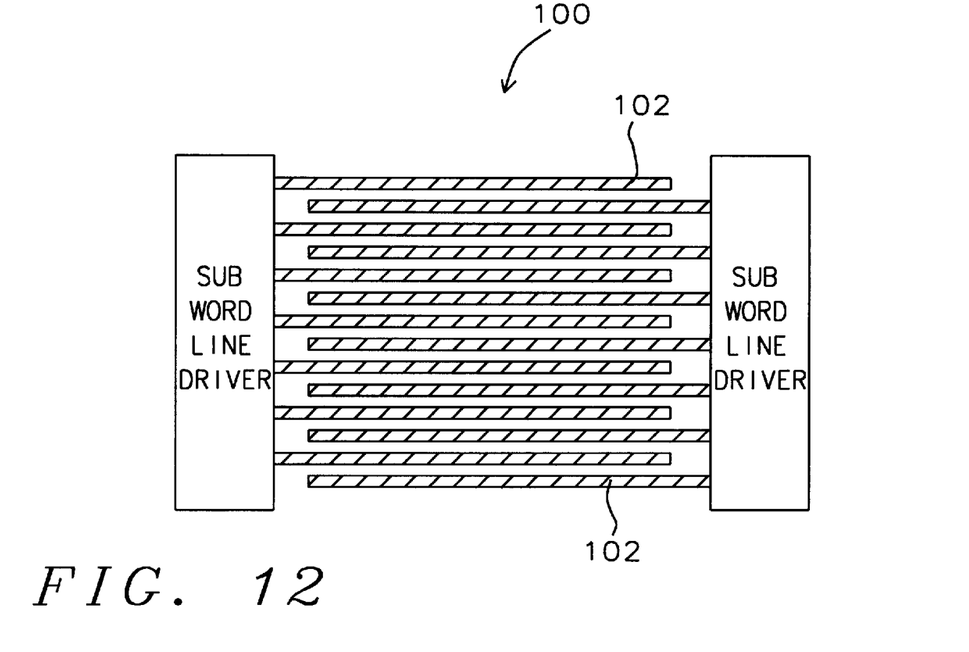
FIG. 12 is a plan view of a conventional sub-wordline section in a DRAM cell array.

FIG. 12 is a plan view of a sub-wordline cell array 100 by conventional design where the polysilicon sub-wordlines 102 are not stitched to an upper level of metal. The maximum number of cells than can be supported by such a sub-wordline without compromising its design performance is determined to be, for example, 1024 cells.

Figure 13:
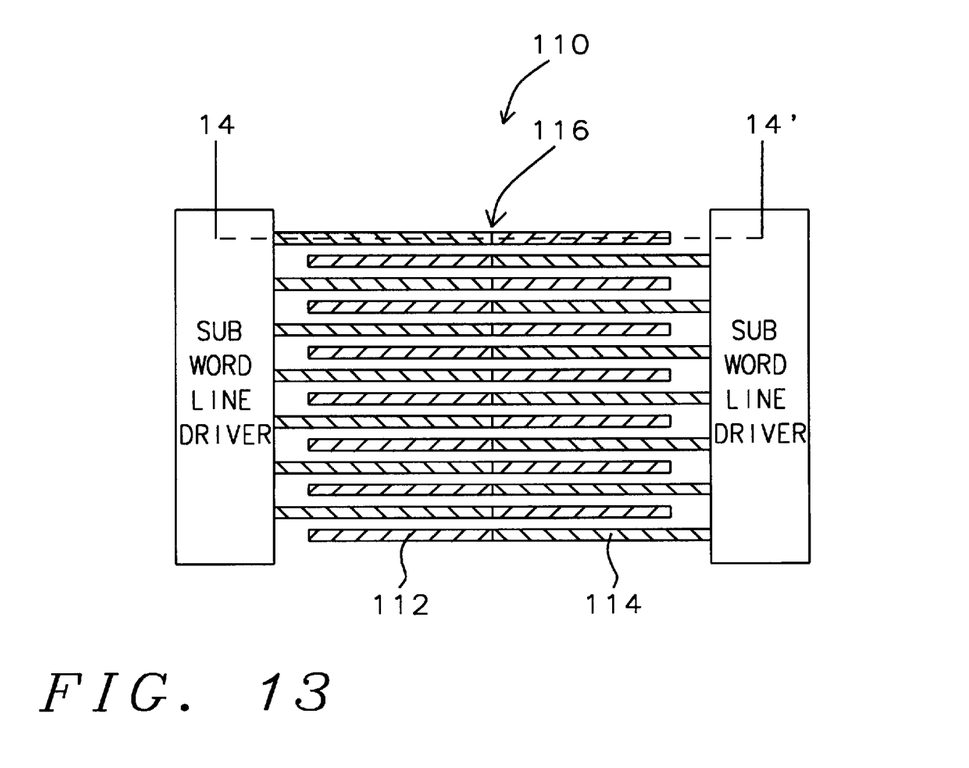
FIG. 13 is a plan view of a sub-wordline section in a DRAM cell array formed according to a second embodiment of this invention.

In FIG. 13 there is shown a sub-wordline cell array 110 wherein each polysilicon sub-wordline 112 has 2048 cells. A metal strap 114 formed from on a first aluminum metal level and extending over the array is connected to the center of each polysilicon sub-wordline by a single contact 116. The performance of the sub-wordlines 112 is effectively the same as that of the 1024 cell sub-wordline 102 in FIG. 11 having two 1024 cell branches from a central contact point 116.

By providing the metal strap 114 in the first aluminum level according to the current invention, the number of sub-wordline decoders can be halved, freeing up valuable space on the chip. In addition, the straps 114 benefit from a relaxed pitch at the metal level of twice that of the polysilicon sub-wordlines. Using the aluminum level instead of the tungsten level for forming these straps is preferred because of the higher conductivity of the aluminum and the avoidance of the DOF problem caused by the step. Cell array structures are formed in the same manner as in the first embodiment except that the step of patterning the tungsten layer is unnecessary and therefore eliminated.

The wordline strap structure is formed by a process nearly identical to that used in to form the first embodiment of this invention. A silicon wafer is provided. A DRAM cell array is formed according to the process steps of the first embodiment and with reference to FIG. 6 until the components of the cell array as shown in FIG. 6 have been formed. The cell array, at this stage of processing is essentially complete.

The next sequence of processing steps form wiring interconnections to the DRAM peripheral circuits. The wiring metallization levels are also used to form the metal straps to which the center portions of the polysilicon sub-wordlines are connected.

Figure 14:
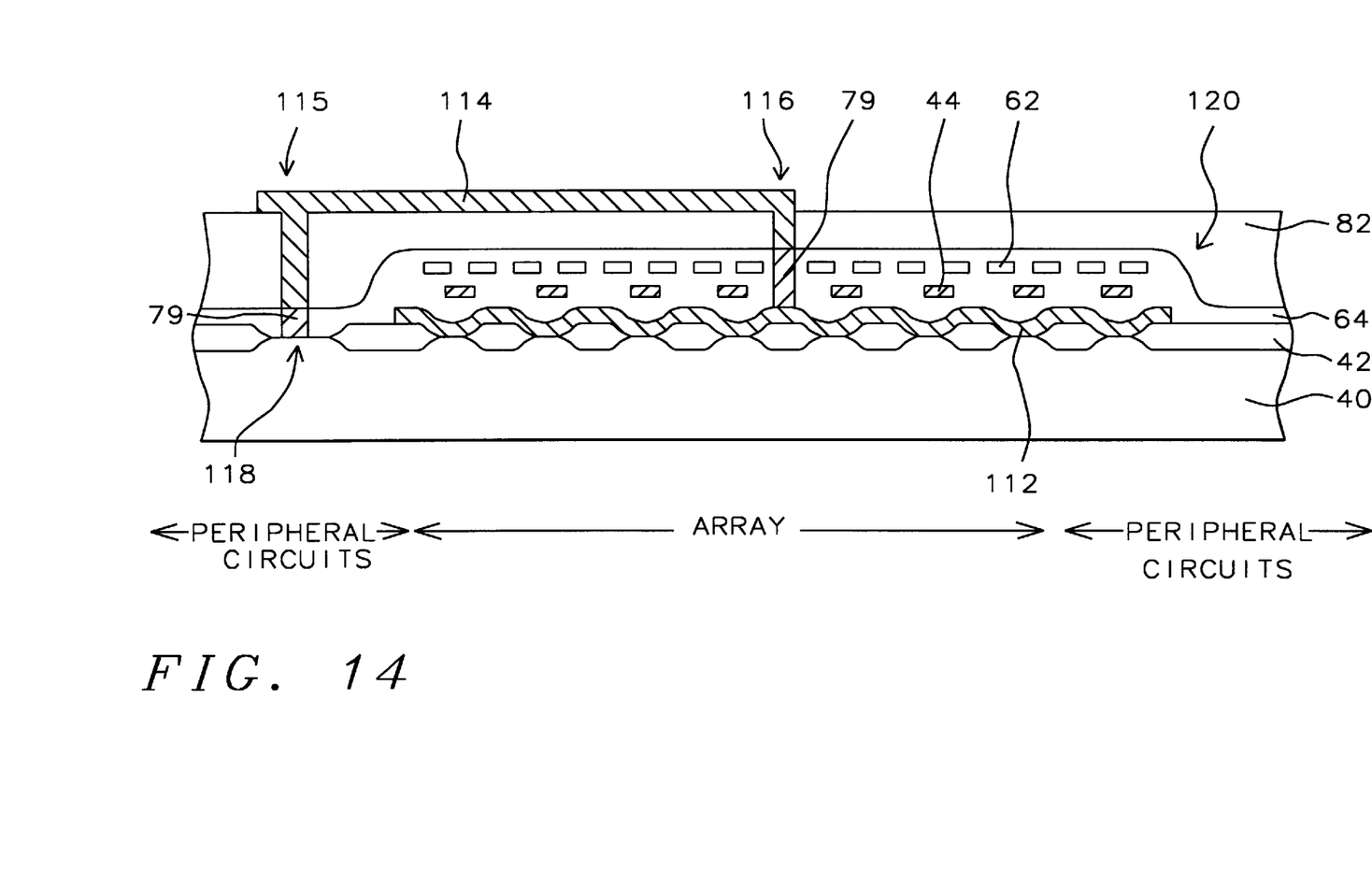
FIG. 14 is a cross sectional view of a portion of a sub-wordline section in a DRAM cell array formed according to a second embodiment of this invention.

Referring to FIG. 14 a cross sectional view of the section along the line 14–14' of FIG. 13 is shown. The view extends into the peripheral region of the array showing an element of a peripheral device 118 which is a component of a sub-wordline decoder to which the metal wordline strap 114 is connected. The topographic step 120 on the insulative layer 64 between the array and the peripheral region is also shown.

In further processing the second embodiment, contact openings 115 are etched by RIE, in the insulative layer 64 over the peripheral devices 118, exposing the elements of these devices. In the same RIE step a contact opening 116 is formed exposing a portion of the polysilicon sub-wordline 112 at its midpoint. Tungsten plugs 79 are then formed in these openings by depositing a tungsten layer over the wafer and etching it back to the insulative layer surface by RIE.

An insulative layer 82, preferably of BPSG, is then deposited over the wafer 40 and globally planarized, preferably by CMP. Via openings 115 and 116 are patterned and etched in the insulative layer 82 by RIE to access the tungsten plugs 79. After stripping the photoresist, an aluminum layer is deposited and patterned with photoresist and etched to form the metal strap 114 completing the conductive path between the midpoint of the polysilicon sub-wordline and the device 118 in the sub-wordline decoder.

As an alternative to the formation of conductive vias of aluminum to connect the tungsten plugs 79 to the metal strap 114, tungsten plugs may be first formed in the openings 115 and 116 by the deposition/etchback technique used to form the tungsten plugs 79. The metal strap 114 is then formed by depositing and patterning the aluminum layer over the tungsten plugs.

While the invention has been particularly shown and described with reference to the preferred embodiments thereof, it will be understood by those skilled in the art that various changes in form and details may be made without departing from the spirit and scope of the invention.

What is claimed is:

1. An integrated circuit memory comprising:
   (a) an array of memory cells arranged in rows and columns;
   (b) a plurality of wordlines each connected to plural cells in at least one respective row of said array;
   (c) a plurality of bitlines each connected to plural cells in at least one respective row of said array;
   (d) peripheral device circuits comprising wordline decoders located on opposite sides of said array; and
   (e) metal straps formed over said wordlines on an insulative layer running parallel with said wordlines and connected along their length to said wordlines by a plurality of metal contacts and at their ends to said wordline decoders;
   wherein said metal straps comprise an alternating sequence of serially interconnected metal line segments in at least two metallization levels, with interconnections formed through openings in an insulative layer separating said metallization levels;
   wherein said alternating sequence is reversed in phase between next adjacent metal straps such that on each respective metallization level, line segments become line gaps and line gaps become line segments;
   wherein at least one of said at least two metallization levels is formed over a globally planarized insulation layer; and
   wherein said metal straps are connected at their ends to said wordline decoders on opposite sides of said array in an alternating sequence by a line segment formed in one of said at least one of said at least two metallization levels formed over said globally planarized insulation layer.

2. The integrated circuit memory of claim 1 wherein said at least two metallization levels are comprise of different metals.

3. The integrated circuit memory of claim 1 wherein one of said at least two metallization levels is tungsten.

4. The integrated circuit memory of claim 1 wherein one of said at least two metallization levels is selected from the group consisting of aluminum, an aluminum alloy, copper, and a copper alloy.

5. An integrated circuit memory sub-wordline section comprising:
   (a) an array of memory cells arranged in rows and columns;
   (b) a plurality of wordlines each connected to plural cells in at least one respective row of said array;
   (c) a plurality of bitlines each connected to plural cells in at least one respective row of said array;
   (d) peripheral device circuits comprising sub wordline decoders located on opposite sides of said array; and
   (e) metal straps formed over said sub-wordlines on an insulative layer running parallel with said wordlines and connected at one end to the midpoints of said sub-wordlines and at the other end to said sub-wordline decoders;
   wherein said metal straps are formed over a globally planarized insulation layer;
   wherein said metal straps are connected at their ends to said sub-wordline decoders on opposite sides of said array in an alternating sequence whereby in accordance with said alternating sequence, said metal straps possess a pitch which is twice that of said sub-wordlines.

6. The integrated circuit memory sub-wordline section of claim 5 wherein said metal straps are selected from the group consisting of aluminum, an aluminum alloy, copper, and a copper alloy.

* * * * *